United States Patent
Kusuda

(10) Patent No.: US 9,496,833 B2
(45) Date of Patent: Nov. 15, 2016

(54) APPARATUS AND METHODS FOR MULTI-CHANNEL AUTOZERO AND CHOPPER AMPLIFIERS

(71) Applicant: Analog Devices, Inc., Norwood, MA (US)

(72) Inventor: Yoshinori Kusuda, San Jose, CA (US)

(73) Assignee: ANALOG DEVICES, INC., Norwood, MA (US)

( * ) Notice: Subject to any disclaimer, the term of this patent is extended or adjusted under 35 U.S.C. 154(b) by 120 days.

(21) Appl. No.: 14/263,214

(22) Filed: Apr. 28, 2014

(65) Prior Publication Data

US 2015/0288336 A1    Oct. 8, 2015

Related U.S. Application Data

(60) Provisional application No. 61/976,841, filed on Apr. 8, 2014.

(51) Int. Cl.
*H03F 3/387* (2006.01)
*H03F 3/45* (2006.01)

(52) U.S. Cl.
CPC .......... *H03F 3/387* (2013.01); *H03F 3/45475* (2013.01); *H03F 3/45968* (2013.01); *H03F 2200/252* (2013.01); *H03F 2200/421* (2013.01); *H03F 2203/45171* (2013.01)

(58) Field of Classification Search
CPC .............................. H03F 3/45892; H03F 1/02
USPC ....................................... 330/9; 327/124, 307
See application file for complete search history.

(56) References Cited

U.S. PATENT DOCUMENTS

| | | |
|---|---|---|
| 3,988,689 A | 10/1976 | Ochi et al. |
| 4,190,805 A | 2/1980 | Bingham |
| 4,808,942 A | 2/1989 | Milkovic |
| 5,077,541 A | 12/1991 | Gilbert |
| 5,258,664 A | 11/1993 | White |
| 6,262,626 B1 | 7/2001 | Bakker et al. |
| 6,380,801 B1 | 4/2002 | McCartney |
| 6,445,248 B1 | 9/2002 | Gilbert |

(Continued)

FOREIGN PATENT DOCUMENTS

WO    WO 2013/123358    8/2013

OTHER PUBLICATIONS

Bakker et al., "A CMOS Nested-Chopper Instrumentation Amplifier with 100-nV Offset", IEEE Journal of Solid-State Circuits, vol. 35, No. 12, pp. 1877-1883, Dec. 2000.

(Continued)

*Primary Examiner* — Henry Choe
(74) *Attorney, Agent, or Firm* — Knobbe Martens Olson & Bear LLP

(57) ABSTRACT

Apparatus and methods for multi-channel autozero and chopper amplifiers are provided herein. In certain configurations, an amplifier includes at least three channels that operate using multiple phases, including at least a non-inverting chop phase, an inverting chop phase, and an autozero phase. The amplifier further includes an autozero and chopping timing control circuit, which at least partially interleaves or staggers timing of the channels' phases. For example, in certain configurations, when one or more of the channels are being autozeroed at a certain time instance, at least some of the remaining channels operate in the non-inverting chop phase or the inverting chop phase.

33 Claims, 8 Drawing Sheets

(56) References Cited

U.S. PATENT DOCUMENTS

| | | | |
|---|---|---|---|
| 6,476,671 B1 | 11/2002 | Tang | |
| 6,657,487 B2 | 12/2003 | Lauffenburger et al. | |
| 6,734,723 B2* | 5/2004 | Huijsing | H03F 3/45982 330/9 |
| 7,091,771 B2 | 8/2006 | Thompson et al. | |
| 7,535,295 B1* | 5/2009 | Huijsing | H03F 1/26 327/124 |
| 7,764,118 B2 | 7/2010 | Kusuda et al. | |
| 7,834,685 B1* | 11/2010 | Pertijs | H03K 5/2472 327/124 |
| 7,973,596 B2* | 7/2011 | Eschauzier | H03F 3/347 330/51 |
| 8,099,073 B1* | 1/2012 | Muller | H04B 1/0483 330/9 |
| 8,120,422 B1* | 2/2012 | Huijsing | H03F 1/083 327/124 |
| 8,405,433 B2 | 3/2013 | Motz et al. | |
| 8,681,029 B1 | 3/2014 | Wang et al. | |
| 8,791,754 B2 | 7/2014 | Lyden et al. | |
| 2010/0238058 A1 | 9/2010 | Scaduto | |
| 2011/0316621 A1 | 12/2011 | Burt et al. | |
| 2014/0232456 A1* | 8/2014 | Huijsing | H03F 1/56 330/9 |
| 2015/0270805 A1* | 9/2015 | Maurino | H03F 1/02 330/9 |

OTHER PUBLICATIONS

Burt et al., "A Micropower Chopper-Stabilized Operational Amplifier using a SC Notch Filter with Synchronous Integration inside the Continuous-Time Signal Path", IEEE J. Solid-State Circuits, vol. 41, No. 12, pp. 2729-2736, Dec. 2006.
Coln, Michael, "Chopper Stabilization of MOS Operational Amplifiers Using Feed-Forward Techniques", IEEE Journal of Solid-State Circuits, vol. SC-16, No. 16, Dec. 1981. 4 pages.
Eklund et al., "Digital Offset Compensation of Time-Interleaved ADS Using Random Chopper Sampling", ISCAS 2000—IEEE International Symposium on Circuits and Systems, May 2000. 4 pages.
Enz et al., "Circuit Techniques for Reducing the Effect of Op-Amp Imperfections: Autozeroing, Correlated Double Sampling, and Chopper Stabilization", Proceedings of the IEEE, vol. 84, No. 11, pp. 1584-1614, Nov. 1996.
Fan et al., "Input characteristics of a chopped multi-path current feedback instrumentation amplifier", IEEE IWASI Dig. Tech. Papers, pp. 61-66, Jun. 2011.
Fan et al., "A 21nV/√Hz Chopper-Stabilized Multipath Current-Feedback Instrumentation Amplifier with 2 μV Offset", IEEE ISSCC Dig. Tech. Papers, Feb. 2010, pp. 80-81.
Kusuda, Y., "Auto Correction Feedback for Ripple Suppresion in a Chopper Amplifier", IEEE J. Solid-State Circuits, vol. 45, No. 8, pp. 1436-1445, Aug. 2010.
Nguyen et al., "A Time-Interleaved Chopper-Stabilized Delta-Sigma Analog to Digital Converter", 9th Annual Conference on Electronics, Circuits and Systems, vol. 1, pp. 299-302, Feb. 2002.
Opris et al., "A Rail-to-Rail Ping-Pong Op-Amp", IEEE Journal of Solid-State Circuits, vol. 31, No. 9, Sep. 1996. 5 pages.
Tang et al., "A 3 μV-Offset Operational Amplifier with 20nV/√Hz Input Noise PSD at DC Employing both Chopping and Autozeroing" IEEE ISSCC Dig. Tech. Papers, Feb. 2002. 2 pages.
LTC1150, Linear Technology, "±15V Chopper Stabilized Operational Amplifier with Internal Capacitors." 1991. 11 pages.
LTC Application Note 21, Linear Technology, "Composite Amplifiers." Jul. 1986. 12 pages.
LTC1150, Linear Technology, "± 15V Zero-Drift Operational Amplifier with Internal Capacitors." 1991. 16 pages.
Analog Devices, AD7910/AD7920 Data Sheet, Rev. C, Sep. 2005. Available at: http://www.analog.com/media/en/technical-documentation/data-sheets/AD7910_7920.pdf (accessed Sep. 10, 2015).
Analog Devices, ADA4522-2 Data Sheet, Rev. 0, May 2015. Available at: http://www.analog.com/media/en/technical-documentation/data-sheets/ADA4522-2.pdf (accessed Sep. 10, 2015).
Denison, T., et. al., "A 2uW 100nV/rtHz Chopper-Stabilized Instrumentation Amplifier for Chronic Measurement of Neural Field Potentials," IEEE Journal of Solid-State Circuits. vol. 42, No. 12, Dec. 2007.
Huang, Q. et al., "A 200nV Offset 6.5nV/rtHz Noise PSD 5.6kHz Chopper Instrumentation Amplifier in 1 um Digital CMOS", Solid-State Circuits Conference, pp. 362-363, Feb. 2001.
Ng, K. A., et al., "A CMOS analog frontend IC for portable EEG/ECG monitoring applications." IEEE Transactions on Circuits and Systems-I: Regular Papers, vol. 52, No. 11, pp. 2335-2347, Nov. 2005.
Sakunia, Saket, "Ping-Pong-Pang Instrumentation Amplifier," Dissertation, TU Delft, Sep. 1, 2010.

* cited by examiner

APPARATUS AND METHODS FOR MULTI-CHANNEL AUTOZERO AND CHOPPER AMPLIFIERS

CROSS-REFERENCE TO RELATED APPLICATIONS

The present application claims priority to U.S. Provisional Patent Application No. 61/976,841, filed Apr. 8, 2014, titled "APPARATUS AND METHODS FOR MULTI-CHANNEL AUTOZERO AND CHOPPER AMPLIFIERS," the entirety of which is hereby incorporated herein by reference.

BACKGROUND

1. Field

Embodiments of the invention relate to electronic systems, and more particularly, to amplifiers.

2. Description of the Related Technology

An amplifier, such as an operational amplifier or an instrumentation amplifier, can include autozero and/or chopper circuitry for reducing the amplifier's input offset voltage.

In one example, an autozero amplifier can include a primary amplifier, an auxiliary amplifier, and a capacitor, and the auxiliary amplifier can operate during an autozero phase to store a voltage across the capacitor to correct for the input offset voltage of the primary amplifier. In another example, a chopper amplifier includes input chopping switches that can be used to chop or modulate the amplifier's input signal during an input chopping operation, thereby up-shifting the frequency of the amplifier's input signal. Additionally, the chopper amplifier can include a filter for filtering the amplifier's input offset voltage, which can be separated in frequency from the chopped input signal. The chopper amplifier can further include output chopping switches for demodulating or down-shifting the frequency of the chopped input signal during an output chopping operation.

Although including autozero and/or chopper circuitry in an amplifier can reduce the amplifier's input offset voltage, the autozero and/or chopper circuitry can also impact operational performance of the amplifier, such as by generating output glitches and/or noise.

SUMMARY

In one aspect, an amplifier is provided. The amplifier includes a plurality of channels including a first channel, a second channel, and a third channel. Each of the first channel, the second channel, and the third channel are operable in a plurality of phases including an autozero phase, a non-inverting chop phase, and an inverting chop phase. The amplifier further includes a timing control circuit configured to operate the first channel in the autozero phase during a first time interval, to operate the second channel in the autozero phase during a second time interval, and to operate the third channel in the autozero phase during a third time interval. The first time interval, the second time interval, and the third time interval are staggered in time with respect to one another.

In another aspect, an amplifier is provided. The amplifier includes a non-inverting input voltage terminal and an inverting input voltage terminal, and the amplifier is configured to receive a differential input voltage between the non-inverting input voltage terminal and the inverting input voltage terminal. The amplifier further includes a plurality of channels comprising a first channel, a second channel, and a third channel. The amplifier further includes a timing control circuit configured to control an autozero sequence of the plurality of channels. The timing control circuit is configured to autozero the first channel during a first time interval, to autozero the second channel during a second time interval, and to autozero the third channel during a third time interval. The first time interval, the second time interval, and the third time interval are staggered in time with respect to one another. During operation of the multi-channel amplifier at least one channel of the plurality of channels is configured to amplify the differential input voltage at any given time.

In another aspect, a method of electronic amplification is provided. The method includes providing a differential input voltage to an amplifier comprising a plurality of channels, the plurality of channels including a first channel, a second channel, and a third channel. The method further includes controlling timing of the plurality of channels using an autozero and chopping timing control circuit. The method further includes autozeroing the first channel during a first time interval using the autozero and chopping timing control circuit, autozeroing the second channel during a second time interval using the autozero and chopping timing control circuit, and autozeroing the third channel during a third time interval using the autozero and chopping timing control circuit. The first time interval, the second time interval, and the third time interval are staggered in time with respect to one another.

DETAILED DESCRIPTION OF EMBODIMENTS

Figure 1:
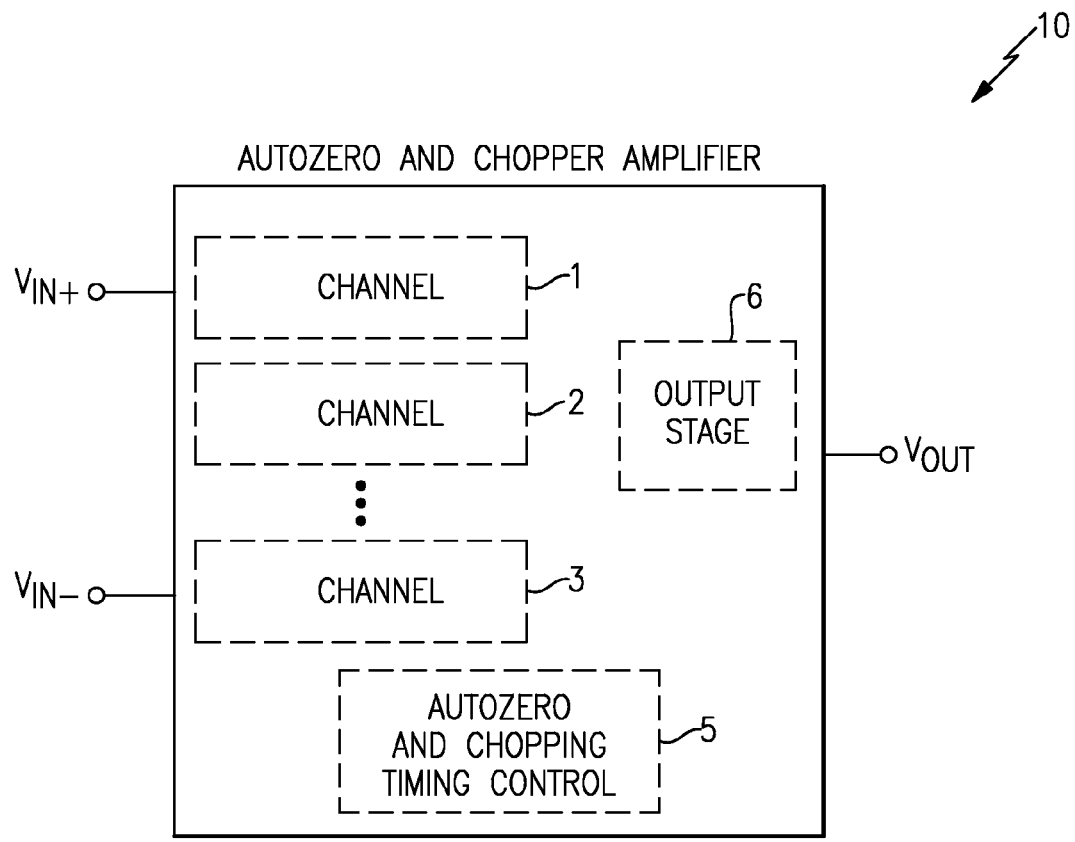
FIG. 1 is a schematic block diagram of one embodiment of a multi-channel autozero and chopper amplifier.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Absent compensation, an amplifier can have an input offset voltage. For example, an amplifier fabricated using a typical complementary metal oxide semiconductor (CMOS) process can have, for instance, an input offset voltage in the range of about 1 mV to about 10 mV. The amplifier can also have flicker or 1/f noise, which can have an associated noise power spectral density (PSD) that becomes larger at lower frequencies.

To reduce or remove input offset voltage and/or flicker noise, an amplifier can include chopper circuitry. In one example, the chopper circuitry includes input chopping switches which chop or modulate the amplifier's input signal during an input chopping operation, thereby up-shifting the frequency of the amplifier's input signal. Furthermore, the chopper circuitry includes output chopping switches which demodulate or down-shift the frequency of the chopped input signal during an output chopping operation.

An amplifier's chopping operation can result in modulated voltage ripples appearing at the amplifier's output. The modulated voltage ripples can have a magnitude that changes in relation to the magnitude of the amplifier's input offset voltage.

For example, an amplifier's chopping operation can result in voltage glitches appearing at the amplifier' output, due to charge injections from switches opening or closing in the input chopping circuit.

Although a low pass post filter can be used to filter ripples after modulation and/or glitches, it can be desirable to reduce the amplifier's input offset voltage while introducing relatively small ripples and/or glitches, thereby relaxing a design constraint of the post filter.

In certain configurations, an amplifier can further include autozero circuitry. By including both autozero and chopper circuitry in an amplifier, the amplifier can have a lower overall input offset voltage resulting in relatively small ripples and/or a design constraint of a post filter can be relaxed.

One example of an amplifier that combines autozero and chopping circuitry can be as described in commonly-owned U.S. Pat. No. 6,476,671, issued Nov. 5, 2002, and titled "PING-PONG AMPLIFIER WITH AUTO-ZEROING AND CHOPPING," which is hereby incorporated by reference in its entirety herein. A ping-pong autozero and chopper amplifier can include two channels, which can be duplicates of one another. Additionally, when the first channel is disconnected to perform autozeroing, the second channel can provide amplification, and vice-versa. Since only one channel provides amplification at a given time, such an amplifier may have approximately double the power consumption and/or area relative to an amplifier that provides a similar amount of amplification without autozeroing. Additionally, when one channel is disconnected from the signal path for autozeroing and the other channel is reconnected to the signal path for amplification, relatively large disturbances can be introduced in the signal path. The signal path disturbances can lead to output glitches and/or noise fold down in the signal band of interest.

Overview of Multi-Channel Autozero and Chopper Amplifiers

Apparatus and methods for multi-channel autozero and chopper amplifiers are provided herein. In certain configurations, an amplifier includes at least three channels that operate using multiple phases, including at least a non-inverting chop phase, an inverting chop phase, and an autozero phase. The amplifier further includes a timing control circuit, which at least partially interleaves or staggers timing of the channels' phases. For example, in certain configurations, when one or more of the channels are being autozeroed at a certain time instance, at least some of the remaining channels operate in the non-inverting chop phase or the inverting chop phase.

When a particular channel operates in the non-inverting chop phase or the inverting chop phase, the channel can contribute to the amplification of the amplifier. For example, in certain configurations, each channel can include a transconductance amplification circuit that generates an output current, and the output currents generated by any channels operating in the non-inverting or inverting chop phases can be summed together to generate a summed current. Additionally, the summed current can be provided to an output stage of the amplifier and/or otherwise processed to generate the amplifier's output signal.

Although a particular channel can contribute to the amplification of the amplifier both when the channel operates in the non-inverting chop phase and when the channel operates in the inverting chop phase, the polarity of the channel's input terminals and the polarity of the channel's output terminals can be reversed or flipped in the inverting chop phase relative to the non-inverting chop phase.

For example, a channel can include an amplification circuit that includes a differential input and a differential output. Additionally, during the non-inverting chop phase, input chopping switches can be used to provide the amplifier's differential input voltage to the differential input of the amplification circuit with positive or non-inverted polarity. Furthermore, during the non-inverting chop phase, output chopping switches can provide the differential output of the amplification circuit without inversion as the channel's output. However, during the inverting chop phase, the input chopping switches can be used to provide the amplifier's differential input voltage to the differential input of the amplification circuit with negative or inverted polarity. Additionally, during the inverting chop phase, the output chopping switches can be used to invert the differential output of the amplification circuit, and to provide the inverted differential output of the amplification circuit as the channel's output. Since both the input chopping switches and the output chopping switches provide inversion during the inverting chop phase, the channel generates an output signal of proper polarity.

The teachings herein can be used to provide an amplifier that consumes less power and/or has a smaller area relative to a ping-pong autozero and chopper amplifier. For instance, a ping-pong autozero and chopper amplifier can have about twice the size and power consumption relative to an amplifier that provides a similar amount of amplification and that operates without autozeroing. In contrast, the amplifiers herein may increase area and/or power consumption (relative to an amplifier without autozeroing) by a smaller amount, since a relatively small proportion of the amplifier's amplification circuitry is disconnected at a time for autozeroing.

Additionally, in certain implementations, the amplifiers herein can introduce relatively small output glitches associated with disconnecting or reconnecting a channel from the amplifier's signal path for autozeroing. For instance, since only a relatively small proportion of the amplifier's amplification circuitry is disconnected or reconnected to the amplifier's signal path a time, the amplifier can have relatively small output glitches and/or noise relative to certain ping-pong autozero and chopper amplifiers.

Furthermore, in certain implementations, the amplifiers herein can introduce relatively small output glitches associated with charge injections from switches opening or closing in the input chopping circuit. For instance, since only a relatively smaller proportion of the total number of the switches can be opening or closing in the amplifier's signal path at a time, the amplifier can have relatively small output glitches and/or noise relative to certain ping-pong autozero and chopper amplifiers.

FIG. 1 is a schematic block diagram of one embodiment of a multi-channel autozero and chopper amplifier 10. The multi-channel autozero and chopper amplifier 10 includes a first channel 1, a second channel 2, a third channel 3, an autozero and chopping timing control circuit 5, and an output stage 6. The illustrated multi-channel autozero and chopper amplifier 10 includes an output voltage terminal $V_{OUT}$ and differential input voltage terminals including a first or non-inverting input voltage terminal $V_{IN+}$ and a second or inverting input voltage terminal $V_{IN-}$.

In the illustrated configuration, the multi-channel autozero and chopper amplifier 10 can be used to amplify a voltage difference between the non-inverting input voltage terminal $V_{IN+}$ and the inverting input voltage terminal $V_{IN-}$ to generate an output voltage on the output voltage terminal $V_{OUT}$. However, other configurations are possible, including, for example, configurations in which the amplifier generates a differential output voltage, a single-ended output current, and/or a differential output current.

Although FIG. 1 illustrates the multi-channel autozero and chopper amplifier 10 as including three channels, the teachings herein are also applicable to configurations including additional channels, such as four or more channels.

The first, second, and third channels 1-3 can each be used to amplify the voltage difference between the non-inverting and inverting input voltage terminals $V_{IN+}$, $V_{IN-}$ when the channel is active. As used herein, a channel can be referred to as "active" at time instances in which the channel contributes to the amplifier's amplification. A channel can be active when the channel operates in a non-inverting chop phase or an inverting chop phase. In contrast, a channel can be referred to as "inactive" at time instances in which the channel does not contribute to the amplifier's amplification. A channel can be inactive when the channel operates in an autozero phase. A channel can also be inactive when the channel is disabled to conserve power or otherwise disconnected from the amplifier's signal path.

The channels 1-3 can include amplification circuitry used to amplify the voltage difference between the non-inverting and inverting input voltage terminals $V_{IN+}$, $V_{IN-}$ when the channel is active.

In one embodiment, each channel includes a transconductance amplification circuit used to generate a channel output current that changes in relation to the amplifier's differential input voltage. Additionally, the channel output currents of active channels can be summed together and further processed by the amplifier to generate the amplifier's output signal.

For example, in the illustrated configuration, the multi-channel autozero and chopper amplifier 10 includes the output stage 6, which can receive the summed current, and generate the output voltage on the output voltage terminal $V_{OUT}$. In certain configurations, the summed current is generated by electrically connecting the channel outputs to one another. For example, in a single-ended configuration, the output of each channel can be electrically connected to a common node, or in differential configuration the differential output of each channel can be electrically connected to a pair of nodes. In one embodiment, the output stage 6 can include a transimpedance amplification circuit. However, other configurations are possible.

An amplifier can undesirably have an input offset voltage. As used herein, an amplifier's input offset voltage can refer to a DC voltage between the amplifier's input terminals that corresponds to an output voltage of about zero. Absent compensation, input offset voltage can degrade operational performance. For example, an input offset voltage can lead to a finite error voltage when the amplifier is connected using feedback.

In the illustrated configuration, the multi-channel autozero and chopper amplifier 10 includes the autozero and chopping timing control circuit 5, which can be used to control the phase that the first, second, and third channels 1-3 operate in. For example, the autozero and chopping timing control circuit 5 can be used to control the time intervals over which the first, second, and third channels 1-3 are autozeroed to reduce or remove input offset voltage, as well as to control chopping operations associated with the channels. While illustrated in connection with n=3 channels, the principles and advantages disclosed herein are applicable to multi-channel autozero and chopper amplifiers having a broad range of values for the number n, including 4, 5, 6, etc.

In one embodiment, the autozero and chopping timing control circuit 5 can be used to control an autozero sequence of the first, second, and third channels 1-3 such that the time intervals associated with autozeroing are interleaved or staggered in time. For example, in certain configurations, the second and third channels 2, 3 can operate in parallel to provide amplification when the first channel 1 is being autozeroed. Additionally, the first and third channels 1, 3 can operate in parallel to provide amplification when the second channel 2 is being autozeroed. Furthermore, the first and second channels 1, 2 can operate in parallel to provide amplification when the third channel 3 is being autozeroed.

Accordingly, the multi-channel autozero and chopper amplifier 10 includes multiple input channels, which are operated with different phase timings.

For example, the illustrated multi-channel autozero and chopper amplifier 10 can consume less power and/or have a smaller area relative to ping-pong autozero and chopper amplifier. For instance, a ping-pong autozero and chopper amplifier can have about twice the size and power consumption relative to an amplifier of similar amplification that operates without autozeroing. In contrast, the multi-channel autozero and chopper amplifier 10 may increase area and/or power consumption by a smaller amount, since a relatively small proportion of the amplifier's amplification circuitry is disconnected at a time for autozeroing.

Additionally, the illustrated multi-channel autozero and chopper amplifier 10 can introduce relatively small glitches on the output voltage terminal $V_{OUT}$ associated with disconnecting or reconnecting a channel from the amplifier's signal path for autozeroing. For instance, since only a relatively small proportion of the amplifier's amplification circuitry is disconnected or reconnected to the amplifier's signal path a time, the multi-channel autozero and chopper amplifier 10 can have relatively small output glitches and/or noise relative to certain ping-pong autozero and chopper amplifiers.

Furthermore, the illustrated multi-channel autozero and chopper amplifier 10 can introduce relatively small glitches on the output voltage terminal $V_{OUT}$ associated with charge injections from switches opening or closing in the input chipping circuit. For instance, since only a relatively small proportion of the total number of switches can be opening or closing in the amplifier's signal path at a time, the multi-channel autozero and chopper amplifier 10 can have relatively small output glitches and/or noise relative to certain ping-pong autozero and chopper amplifiers.

Figure 2A:
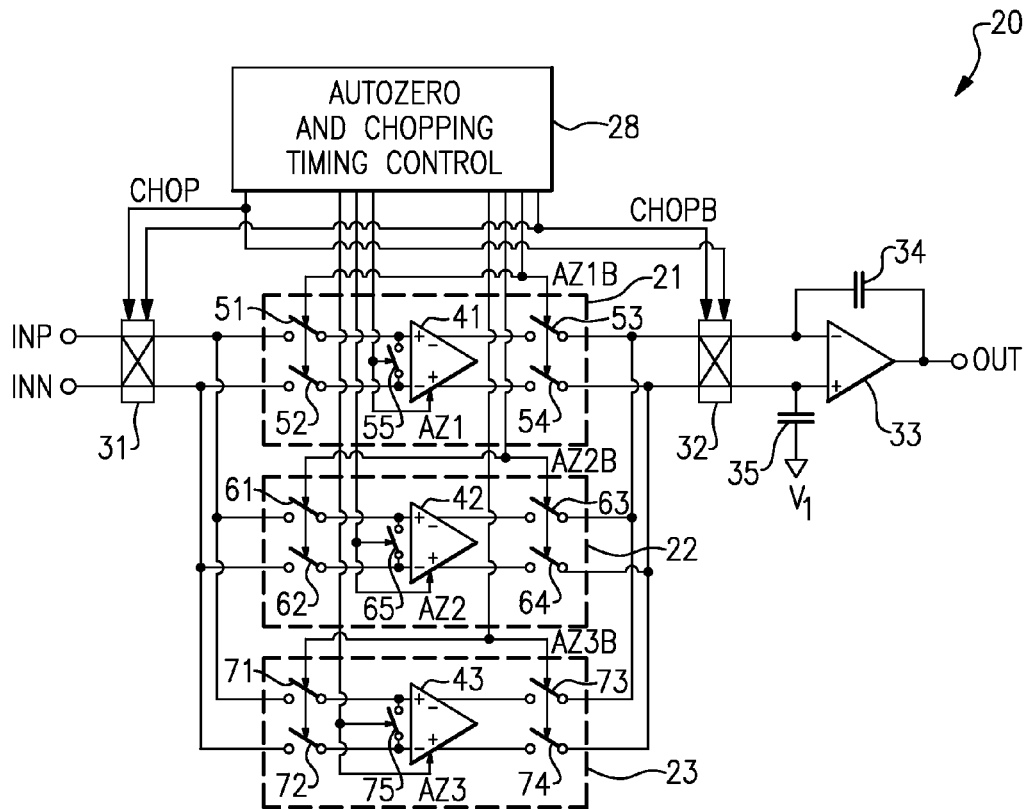
FIG. 2A is a schematic block diagram of one embodiment of a multi-channel autozero and chopper amplifier.
Figure 2B:
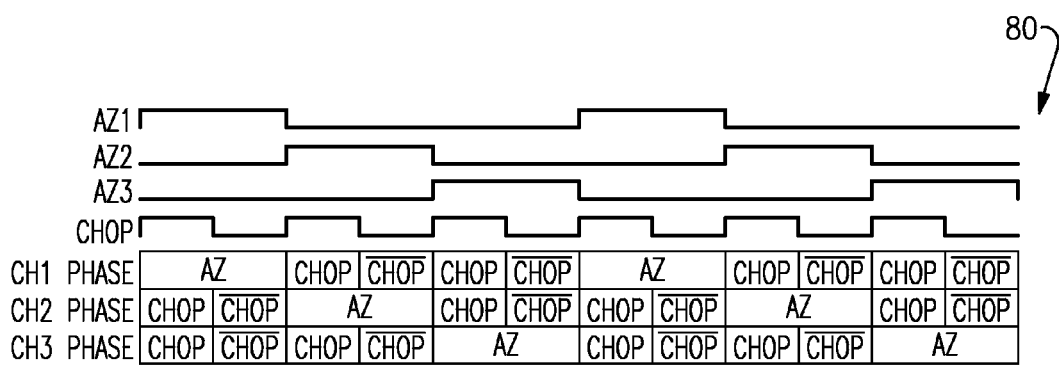
FIG. 2B illustrates one example of a timing diagram for the multi-channel autozero and chopper amplifier of FIG. 2A.

FIG. 2A is a schematic block diagram of one embodiment of a multi-channel autozero and chopper amplifier 20. FIG. 2B illustrates one example of a timing diagram 80 for the multi-channel autozero and chopper amplifier 20 of FIG. 2A.

The amplifier 20 includes a first channel 21, a second channel 22, a third channel 23, an autozero and chopping timing control circuit 28, input chopping switches 31, output chopping switches 32, an output amplification circuit 33, a feedback capacitor 34, and an integration capacitor 35. Additionally, the amplifier 20 includes a first or non-inverting input terminal INP, a second or inverting input terminal INN, and an output terminal OUT.

Although the amplifier 20 shown in FIG. 2A includes three channels, the teachings herein are applicable to amplifiers including additional channels, such as four or more channels. Additionally, although FIG. 2B illustrates one example of a timing scheme for the multi-channel autozero and chopper amplifier 20 of FIG. 2A, the multi-channel autozero and chopper amplifier 20 can be configured to operate using other timing schemes.

In the illustrated configuration, the autozero and chopping timing control circuit 28 generates a non-inverted chopping clock signal CHOP, an inverted chopping clock signal CHOPB, first to third non-inverted autozero clock signals AZ1-AZ3, and first to third inverted autozero clock signals AZ1B-AZ3B. The non-inverted and inverted chopping clock signals CHOP, CHOPB can control chopping operations of the input chopping switches 31 and the output chopping switches 32, and the first to third non-inverted autozero clock signals AZ1-AZ3 and the first to third inverted autozero clock signals AZ1B-AZ3B can control autozero operations of the first to third channels 21-23, respectively.

As shown in FIG. 2A, the input chopping switches 31 include a first switch input electrically connected to the non-inverting input terminal INP, a second switch input electrically connected to the inverting input terminal INN, a first clock input that receives the non-inverted chopping clock signal CHOP, and a second clock input that receives the inverted chopping clock signal CHOPB. Additionally, the input chopping switches 31 include first and second switch outputs, which operate to provide a differential input signal to the first to third channels 21-23.

In certain configurations, the inverted chopping clock signal CHOPB can correspond to an inverted version of the non-inverted chopping clock signal CHOP, and the first to third inverted autozero clock signals AZ1B-AZ3B can correspond to inverted versions of the first to third non-inverted autozero clock signals AZ1-AZ3, respectively. As skilled artisans will appreciate, a non-inverted clock signal and an inverted clock signal need not be perfectly complementary versions of one another. For example, in one embodiment, the non-inverted chopping clock signal CHOP and the inverted chopping clock signal CHOPB are generated by a non-overlapping clock signal generator.

The output chopping switches 32 include first and second switch inputs, which receive a combined differential output signal generated by the first to third channels 21-23. The output chopping switches 32 further include a first clock input that receives the inverted chopping clock signal CHOPB, a second clock input that receives the non-inverted chopping clock signal CHOP, a first switch output electrically connected to an inverting input of the output amplification circuit 33, and a second switch output electrically connected to a non-inverting input of the output amplification circuit 33. The output amplification circuit 33 further includes an output electrically connected to the output terminal OUT. The feedback capacitor 34 is electrically connected between the output and the inverting input of the output amplification circuit 33. The integration capacitor 35 is electrically connected between the non-inverting input of the output amplification circuit 33 and a first voltage $V_1$, which can be, for example, a power low or ground supply.

The first channel 21 includes first to fifth autozero switches 51-55, respectively, and a first transconductance amplification circuit 41. The first autozero switch 51 is electrically connected between a non-inverting input of the first transconductance amplification circuit 41 and the first switch output of the input chopping switches 31. Additionally, the second autozero switch 52 is electrically connected between an inverting input of the first transconductance amplification circuit 41 and the second switch output of the input chopping switches 31. Furthermore, the third autozero switch 53 is electrically connected between an inverting output of the first transconductance amplification circuit 41 and the first switch input of the output chopping switches 32. Additionally, the fourth autozero switch 54 is electrically connected between a non-inverting output of the first transconductance amplification circuit 41 and the second switch input of the output chopping switches 32. Furthermore, the fifth autozero switch 55 is electrically connected between the non-inverting and inverting inputs of the first transconductance amplification circuit 41. In the illustrated configuration, the first to fourth autozero switches 51-54 can be opened or closed using the first inverted autozero clock signal AZ1B, the fifth autozero switch 55 can be opened or closed using the first non-inverted autozero clock signal AZ1, and the first transconductance amplification circuit 41 can be autozeroed using the first non-inverted autozero clock signal AZ1.

The second channel 22 includes first to fifth autozero switches 61-65, respectively, and a second transconductance amplification circuit 42. The first autozero switch 61 is electrically connected between a non-inverting input of the second transconductance amplification circuit 42 and the first switch output of the input chopping switches 31. Additionally, the second autozero switch 62 is electrically connected between an inverting input of the second transconductance amplification circuit 42 and the second switch output of the input chopping switches 31. Furthermore, the third autozero switch 63 is electrically connected between an inverting output of the second transconductance amplification circuit 42 and the first switch input of the output chopping switches 32. Additionally, the fourth autozero switch 64 is electrically connected between a non-inverting output of the second transconductance amplification circuit 42 and the second switch input of the output chopping switches 32. Furthermore, the fifth autozero switch 65 is electrically connected between the non-inverting and inverting inputs of the second transconductance amplification circuit 42. In the illustrated configuration, the first to fourth autozero switches 61-64 can be opened or closed using the second inverted autozero clock signal AZ2B, the fifth autozero switch 65 can be opened or closed using the second non-inverted autozero clock signal AZ2, and the second transconductance amplification circuit 42 can be autozeroed using the second non-inverted autozero clock signal AZ2.

The third channel 23 includes first to fifth autozero switches 71-75, respectively, and a third transconductance amplification circuit 43. The first autozero switch 71 is electrically connected between a non-inverting input of the third transconductance amplification circuit 43 and the first switch output of the input chopping switches 31. Additionally, the second autozero switch 72 is electrically connected between an inverting input of the third transconductance amplification circuit 43 and the second switch output of the input chopping switches 31. Furthermore, the third autozero switch 73 is electrically connected between an inverting output of the third transconductance amplification circuit 43 and the first switch input of the output chopping switches 32. Additionally, the fourth autozero switch 74 is electrically connected between a non-inverting output of the third transconductance amplification circuit 43 and the second switch input of the output chopping switches 32. Furthermore, the fifth autozero switch 75 is electrically connected between the non-inverting and inverting inputs of the third transconductance amplification circuit 43. In the illustrated configuration, the first to fourth autozero switches 71-74 can be opened or closed using the third inverted autozero clock signal AZ3B, the fifth autozero switch 75 can be opened or closed using the third non-inverted autozero clock signal AZ3, and the third transconductance amplification circuit 43 can be autozeroed using the third non-inverted autozero clock signal AZ3.

In the illustrated configuration, each of the three channels 21-23 of the amplifier can operate in an autozero phase, a non-inverting chop phase, or an inverting chop phase. However, other configurations are possible, such as configurations in which channels operate using additional phases. For example, in one embodiment, a channel can be operated in a coarse autozero phase and a fine autozero phase. In another embodiment, a channel can also be operated in a disabled or inactive phase.

In the illustrated configuration, a particular channel's autozero switches can be used to disconnect the channel from the amplification path of the amplifier 20 when the channel operates in the autozero phase. For instance, when the autozero and chopping timing control circuit 28 operates the first channel 21 in the autozero phase, the first non-inverted autozero clock signal AZ1 can be used to open the first to fourth autozero switches 51-54 to disconnect the first transconductance amplification circuit 41 from the amplifier's amplification path. Additionally, the first inverted autozero clock signal AZ1B can be used to close the fifth autozero switch 55 to electrically connect the first transconductance amplification circuit's non-inverting input and inverting input to one another, and to initiate an autozero operation of the first transconductance amplification circuit 41. Similarly, when the autozero and chopping timing control circuit 28 operates the second channel 22 in the autozero phase, the second non-inverted autozero clock signal AZ2 can be used to open the first to fourth autozero switches 61-64, and the second inverted autozero clock signal AZ2B can be used to close the fifth autozero switch 65 and to autozero the second transconductance amplification circuit 42. Likewise, when the autozero and chopping timing control circuit 28 operates the third channel 23 in the autozero phase, the third non-inverted autozero clock signal AZ3 can be used to open the first to fourth autozero switches 71-74, and the third inverted autozero clock signal AZ3B can be used to close the fifth autozero switch 75 and to autozero the third transconductance amplification circuit 43.

In one embodiment, the first transconductance amplification circuit 41 includes a primary transconductor, an auxiliary transconductor, and at least one capacitor. Additionally, the primary transconductor generates a differential output current that changes in relation to a differential input voltage to the first transconductance amplification circuit 41. Furthermore, the auxiliary transconductor generates a differential output current that compensates for an input offset voltage of the primary transconductor. When the first channel 21 operates in the autozero phase, the differential output current generated by the primary transconductor is based on the primary transconductor's input offset voltage, and the auxiliary transconductor can operate with feedback to store at least one voltage across the at least one capacitor to correct for the primary transconductor's input offset voltage. Accordingly, when the first channel 21 operates in the non-inverting chop phase or the inverting chop phase, the first channel 21 can provide amplification with a relatively small amount of input offset. Additionally, the second and third transconductance amplification circuits 42, 43 can include similar circuitry and can operate in a manner similar to that described above. Although one example of an autozero scheme has been described, the teachings herein are applicable to other configurations of autozeroing.

As shown in the timing diagram 80 of FIG. 2B, the operation of the first to third channels 21-23 in the autozero phase (AZ) is interleaved or staggered in time. For instance, when the first channel 21 operates in the autozero phase, the second and third channels 22, 23 both either operate in the non-inverting chop phase (CHOP) or the inverting chop phase (CHOP). Similarly, when the second channel 22 operates in the autozero phase, the first and third channels 21, 23 both either operate in the non-inverting chop phase or the inverting chop phase. Likewise, when the third channel 23 operates in the autozero phase, the first and second channels 21, 22 both either operate in the non-inverting chop phase or the inverting chop phase.

In the illustrated configuration, the first to third channels 21-23 each include an input transconductance amplification circuit and autozero switches controlled by interleaved autozero clock signals AZ1, AZ2, and AZ3. As shown in FIG. 2A, the channels share input chopping switches and output chopping switches. Although the first to third channels can share input chopping switches and output chopping switches, not all of the channels operate in the non-inverting chop phase or the inverting chop phase at the same time. For example, a particular channel's autozero switches can be used to disconnect that channel from the amplifier's signal path during the autozero phase.

In the illustrated configuration, the output current of any channels that operate in the inverting chop phase or the non-inverting chop phase can be summed together to generate a summed current, which can be provided to the amplifier's output stage. In the illustrated configuration, two channels provide amplification when another channel is being autozeroed. Accordingly, the power dissipation of an individual channel is about one-half of that relative to a ping-pong autozero and chopper amplifier that provides a similar amount of amplification, since each channel of a ping-pong autozero and chopper amplifier should provide the amplifier's entire gain at any given time instance.

The illustrated amplifier can also have smaller output ripples relative to a conventional chopper amplifier, since the illustrated amplifier combines autozero and chopping operations.

Figure 3A:
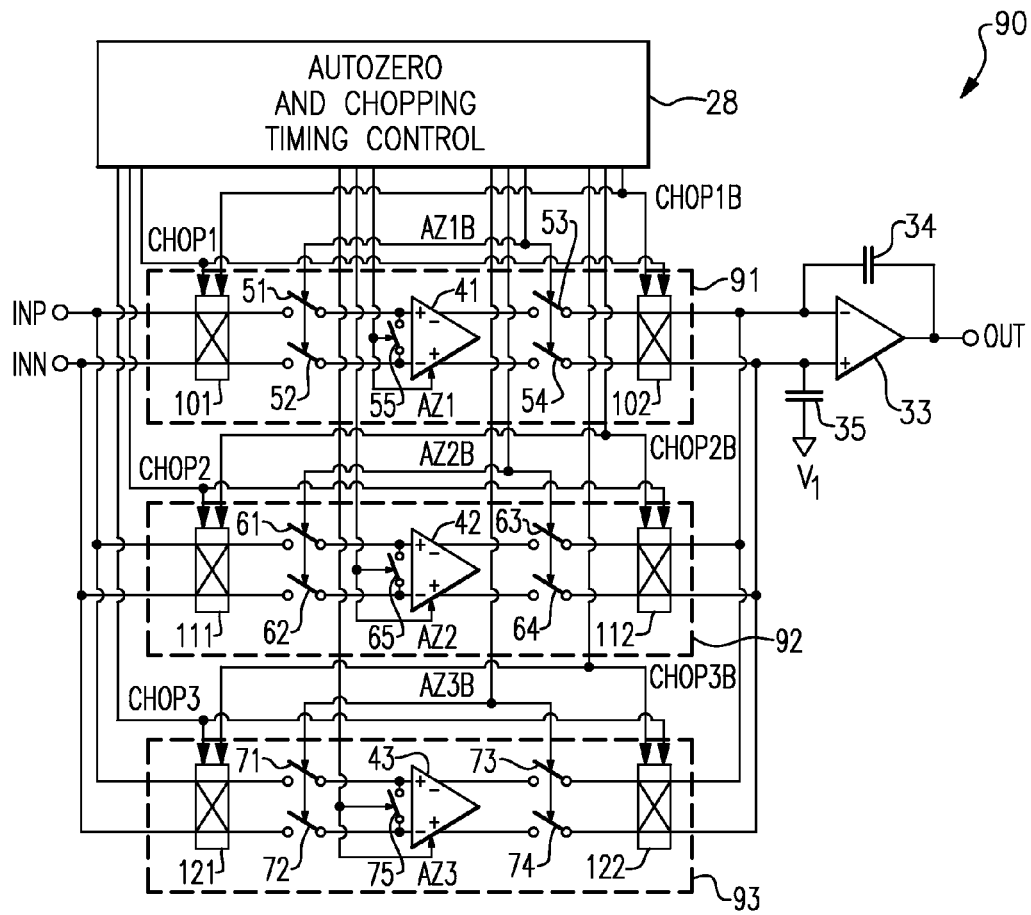
FIG. 3A is a schematic block diagram of another embodiment of a multi-channel autozero and chopper amplifier.
Figure 3B:
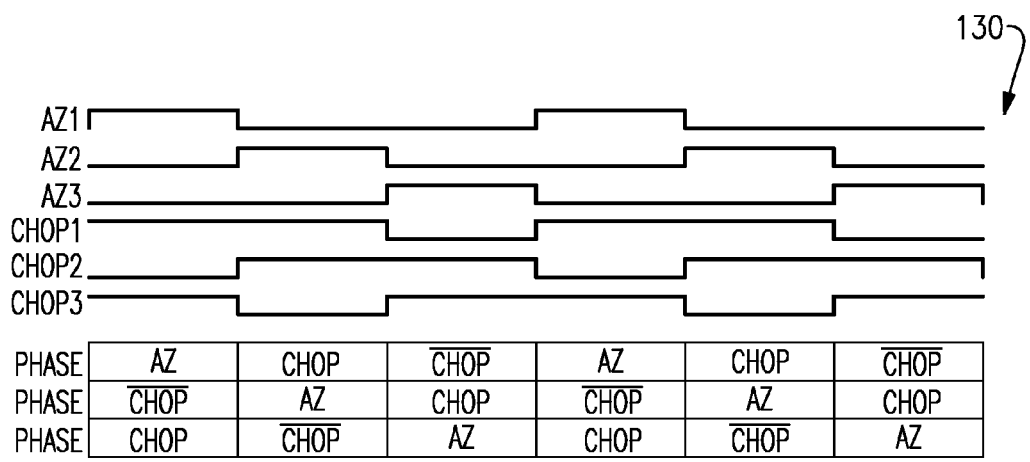
FIG. 3B is illustrates one example of a timing diagram for the multi-channel autozero and chopper amplifier of FIG. 3A.

FIG. 3A is a schematic block diagram of another embodiment of a multi-channel autozero and chopper amplifier 90. FIG. 3B illustrates one example of a timing diagram 130 for the multi-channel autozero and chopper amplifier 90 of FIG. 3A.

The amplifier 90 includes the autozero and chopping timing control circuit 28, the output amplification circuit 33, the feedback capacitor 34, the integration capacitor 35, the non-inverting input terminal INP, the inverting input terminal INN, and the output terminal OUT, which can be as described earlier. The amplifier 90 further includes a first channel 91, a second channel 92, and a third channel 93.

Although the amplifier 90 shown in FIG. 3A includes three channels, the teachings herein are applicable to amplifiers including additional channels, such as four or more channels. Additionally, although FIG. 3B illustrates one example of a timing scheme for the multi-channel autozero and chopper amplifier 90 of FIG. 3A, the multi-channel autozero and chopper amplifier 90 can be configured to operate using other timing schemes.

The first channel 91 includes first to fifth autozero switches 51-55 and the first transconductance amplification circuit 41, which can be as described earlier. The first channel 91 further includes first input chopping switches 101 and first output chopping switches 102. The second channel 92 includes first to fifth autozero switches 61-65 and the second transconductance amplification circuit 42, which can be as described earlier. The second channel 92 further includes second input chopping switches 111 and second output chopping switches 112. The third channel 93 includes first to first autozero switches 71-75 and the third transconductance amplification circuit 43, which can be as described earlier. The third channel 93 further includes third input chopping switches 121 and third output chopping switches 122.

The amplifier 90 of FIG. 3A is similar to the amplifier 20 of FIG. 2A, except that the amplifier 90 includes channels implemented with separate input and output chopping switches.

In the illustrated configuration, the input and output chopping switches of the first, second, and third channels can be controlled by independent and interleaved chopping clock signals. For instance, the first input chopping switches 101 and the first output chopping switches 102 can be controlled by a first non-inverted chopping clock signal CHOP1 and a first inverted chopping clock signal CHOP1B, the second input chopping switches 111 and the second output chopping switches 112 can be controlled by a second non-inverted chopping clock signal CHOP2 and a second inverted chopping clock signal CHOP2B, and the third input chopping switches 121 and the third output chopping switches 122 can be controlled by a third non-inverted chopping clock signal CHOP3 and a third inverted chopping clock signal CHOP3B.

Accordingly, in contrast to the amplifier 20 of FIG. 2A which shares input and output chopping switches amongst channels, the amplifier 90 of FIG. 3A includes channels including separate input and output chopping switches. However, other configurations are possible, such as implementations in which channels share input chopping switches but include separate output chopping switches or implementations in which channels share output chopping switches but include separate input chopping switches.

Configuring an amplifier to include separate input and output chopping switches permits the chopping clock signals to operate at lower frequency relative to shared chopping switch configuration. Operating chopping clock signals at lower frequency can result in a smaller amount of charge injection during clock signal transitions. For instance, the amplifier 90 of FIG. 3A can have a smaller amount of output voltage and/or current glitches relative to amplifier 20 of FIG. 2A.

Moreover, the width of the transistors used to implement the input and output chopping switches of FIG. 3A can be smaller for a given performance relative to that of a conventional chopper amplifier, since multiple input and output chopping switches can operate in parallel in the configuration shown in FIG. 3A. Switches having relatively small size can be associated with relatively small voltage and/or current spikes during clock signal transitions.

Although FIGS. 2A and 3A show multi-channel amplifiers that include three channels, the amplifiers can be adapted to include four or more channels. In one embodiment, four channels can be provided in parallel, and one channel can be in an autozero phase while the remaining three channels can be in either a non-inverting chop phase or an inverting-chop phase at a time. In another embodiment, N input channels can be provided in parallel, and one channel can be in autozero phase while the remaining N−1 channels can be in either a non-inverting chop phase or an inverting chop phase at a time. In yet another embodiment, N input channels can be provided in parallel, and M channels can be in autozero phase while the remaining N−M channels can be in either a non-inverting chop phase or an inverting-chop phase at a time. In certain configurations, M and N are integers satisfying the inequality M<N/2.

Furthermore, although FIGS. 2A and 3A illustrate channels in the context of an operational amplifier, the teachings herein can be applied to other types of amplifiers, including, for example, instrumentation amplifiers, variable gain amplifiers, and/or switched capacitor amplifiers.

Figure 4A:
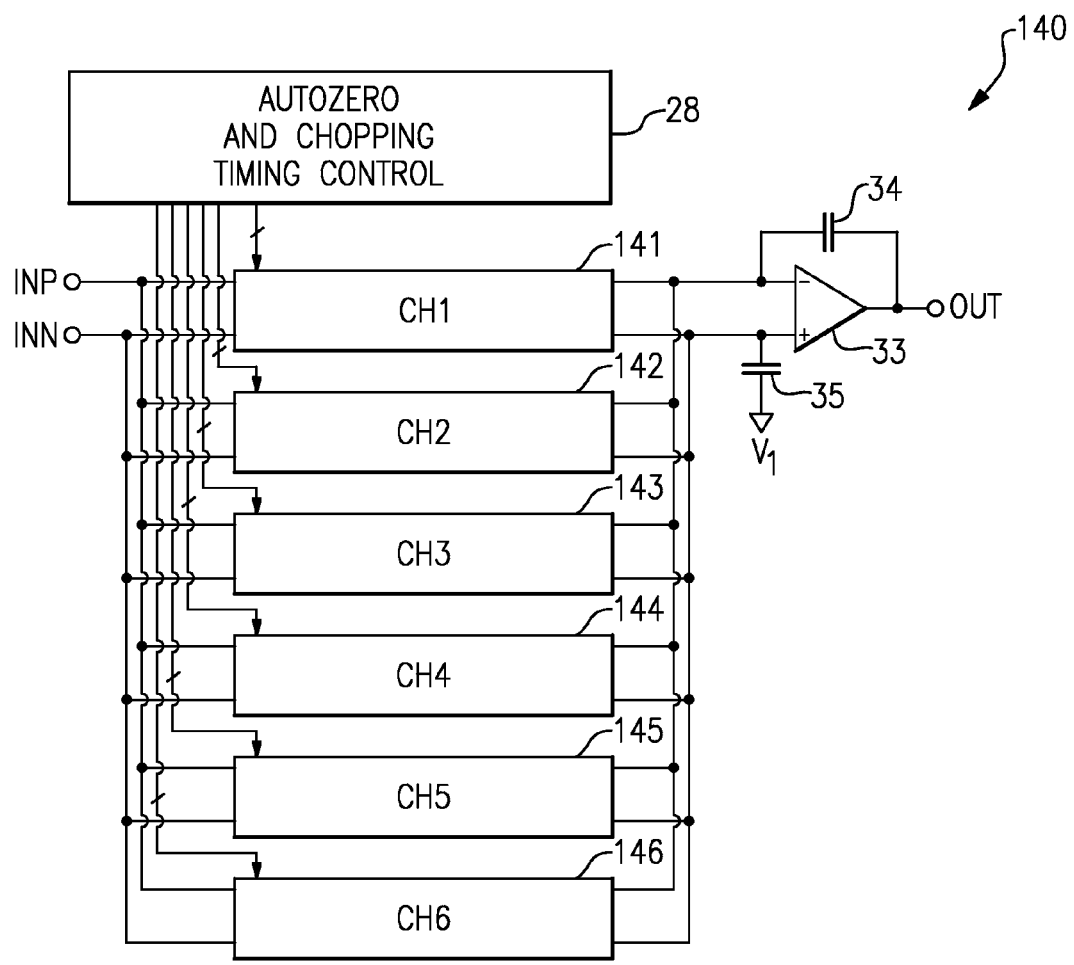
FIG. 4A is a schematic block diagram of another embodiment of a multi-channel autozero and chopper amplifier.

FIG. 4A is a schematic block diagram of another embodiment of a multi-channel autozero and chopper amplifier 140. The illustrated amplifier 140 includes the autozero and chopping timing control circuit 28, the output amplification circuit 33, the feedback capacitor 34, the integration capacitor 35, the non-inverting input terminal INP, the inverting input terminal INN, and the output terminal OUT, which can be as described earlier. The amplifier 140 further includes a first channel 141, a second channel 142, a third channel 143, a fourth channel 144, a fifth channel 145, and a sixth channel 146.

Although the amplifier 140 shown in FIG. 4A includes six channels, the teachings herein are applicable to amplifiers including more or fewer channels.

The first to sixth channels 141-146 each include a differential input electrically connected to the non-inverting and inverting input terminals INP, INN. The first to sixth channels 141-146 each include a differential output electrically connected to the non-inverting and inverting inputs of the output amplification circuit 33.

As shown in FIG. 4A, the autozero and chopping timing control circuit 28 can be used to control the phases that each of the first to sixth channels 141-146 operate in. For example, the autozero and chopping timing control circuit 28 can provide a first plurality of clock signals to the first channel 141, a second plurality of clock signals to the second channel 142, a third plurality of clock signals to the third channel 143, a fourth plurality of clock signals to the fourth channel 144, a fifth plurality of clock signals to the fifth channel 145, and a sixth plurality of clock signals to the sixth channel 146. The clock signals can include, for example, chopping clock signals and autozero clock signals.

Additional details of the amplifier 140 can be similar to those described earlier.

Figure 4B:
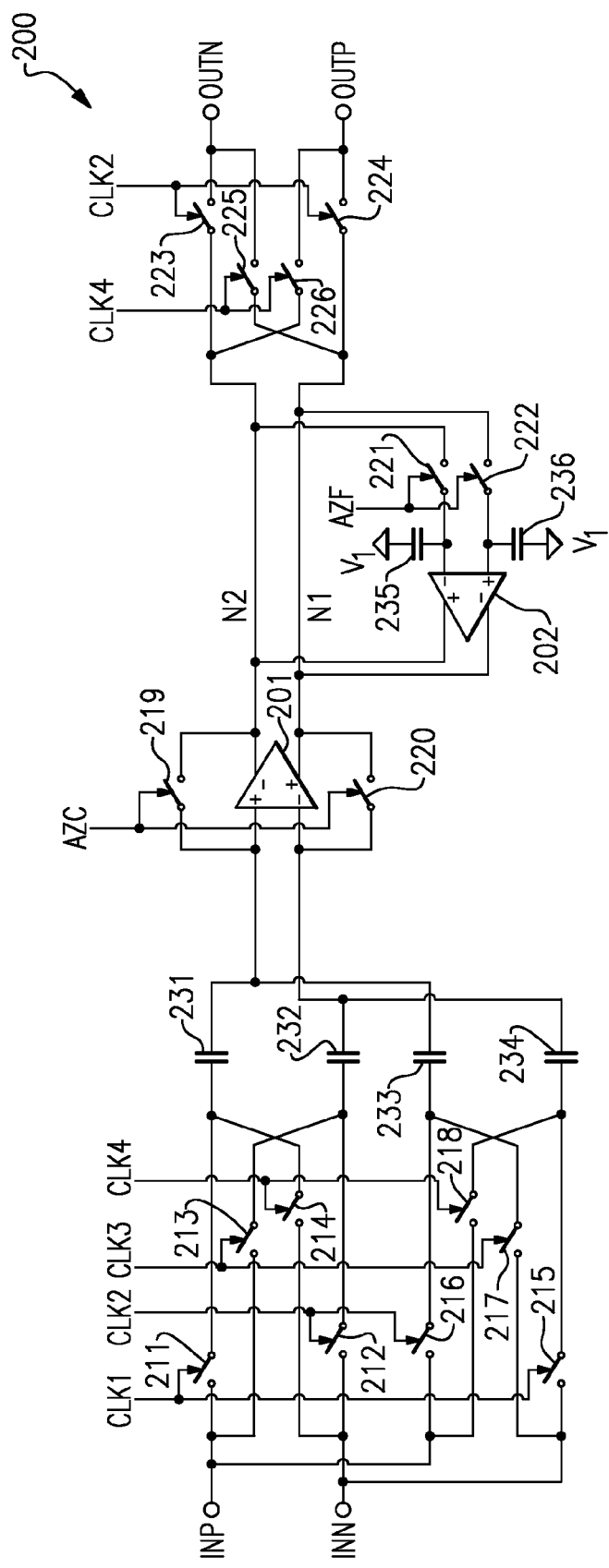
FIG. 4B is a circuit diagram of one embodiment of a channel of the multi-channel autozero and chopper amplifier of FIG. 4A.

FIG. 4B is a circuit diagram of one embodiment of a channel 200 of the multi-channel autozero and chopper amplifier 140 of FIG. 4A. The channel 200 includes a non-inverting input terminal INP and an inverting input terminal INN, which operate as the channel's differential input. The channel 200 further includes a non-inverting output terminal OUTP and an inverting output terminal OUTN, which operate as the channel's differential output.

The channel 200 further includes a primary transconductor 201, an auxiliary transconductor 202, a first switch 211, a second switch 212, a third switch 213, a fourth switch 214, a fifth switch 215, a sixth switch 216, a seventh switch 217, an eighth switch 218, a ninth switch 219, a tenth switch 220, an eleventh switch 221, a twelfth switch 222, a thirteenth switch 223, a fourteenth switch 224, a fifteenth switch 225, a sixteenth switch 226, a first capacitor 231, a second capacitor 232, a third capacitor 233, a fourth capacitor 234, a fifth capacitor 235, and a sixth capacitor 236.

As shown in FIG. 4B, the channel 200 receives a first chopping clock signal CLK1, a second chopping clock signal CLK2, a third chopping clock signal CLK3, a fourth chopping clock signal CLK4, a coarse autozero clock signal AZC, and a fine autozero clock signal AZF, which can be generated by the autozero and chopping timing control circuit 28 of FIG. 4A.

The first switch 211 includes a switch input electrically connected to the non-inverting input terminal INP, a control input that receives the first chopping clock signal CLK1, and a switch output electrically connected to a first end of the first capacitor 231. The second switch 212 includes a switch input electrically connected to the inverting input terminal INN, a control input that receives the second chopping clock signal CLK2, and a switch output electrically connected to a first end of the second capacitor 232. The third switch 213 includes a switch input electrically connected to the non-inverting input terminal INP, a control input that receives the third chopping clock signal CLK3, and a switch output electrically connected to the first end of the second capacitor 232. The fourth switch 214 includes a switch input electrically connected to the inverting input terminal INN, a control input that receives the fourth chopping clock signal CLK4, and a switch output electrically connected to the first end of the first capacitor 231.

The fifth switch 215 includes a switch input electrically connected to the inverting input terminal INN, a control input that receives the first chopping clock signal CLK1, a switch output electrically connected to a first end of the fourth capacitor 234. The sixth switch 216 includes a switch input electrically connected to the non-inverting input terminal INP, a control input that receives the second chopping clock signal CLK2, and a switch output electrically connected to a first end of the third capacitor 233. The seventh switch 217 includes a switch input electrically connected to the inverting input terminal INN, a control input that receives the third chopping clock signal CLK3, and a switch output electrically connected to the first end of the third capacitor 233. The eighth switch 218 includes a switch input electrically connected to the non-inverting input terminal INP, a control input that receives the fourth chopping clock signal CLK4, and a switch output electrically connected to the first end of the fourth capacitor 234.

The ninth switch 219 includes a switch input electrically connected to an inverting output of the primary transconductor 201 and a control input that receives the coarse autozero clock AZC. The ninth switch 219 further includes a switch output electrically connected to a second end of the first capacitor 231, to a second end of the third capacitor 233, and to a non-inverting input of the primary transconductor 201. The tenth switch 220 includes a switch input electrically connected to a non-inverting output of the primary transconductor 201 and a control input that receives the coarse autozero clock AZC. The tenth switch 220 further includes a switch output electrically connected to a second end of the second capacitor 232, to a second end of the fourth capacitor 234, and to an inverting input of the primary transconductor 201. The eleventh switch 221 includes a switch input electrically connected to the inverting output of the primary transconductor 201, a control input that receives the fine autozero clock signal AZF, and a switch output electrically connected to a first end of the fifth capacitor 235 and to an inverting input of the auxiliary transconductor 202. The twelfth switch 222 includes a switch input electrically connected to the non-inverting output of the primary transconductor 201, a control input that receives the fine autozero clock signal AZF, and a switch output electrically connected to a first end of the sixth capacitor 236 and to a non-inverting input of the auxiliary transconductor 202. The auxiliary transconductor 202 further includes an inverting output electrically connected to the non-inverting output of the primary transconductor 201 at a first node N1, and a non-inverting output electrically connected to the inverting output of the primary transconductor 201 at a second node N2. The fifth capacitor 235 and the sixth capacitor 236 each further include a second end electrically connected to the first voltage $V_1$.

The thirteenth switch 223 includes a switch input electrically connected to the inverting output of the primary transconductor 201, a control input that receives the second chopping clock signal CLK2, and a switch output electrically connected to the inverting output terminal OUTN. The fourteenth switch 224 includes a switch input electrically connected to the non-inverting output of the primary transconductor 201, a control input that receives the second chopping clock signal CLK2, a switch output electrically connected to the non-inverting output terminal OUTP. The fifteenth switch 225 includes a switch input electrically connected to the non-inverting output of the primary transconductor 201, a control input that receives the fourth chopping clock signal CLK4, and a switch output electrically connected to the inverting output terminal OUTN. The sixteenth switch 226 includes a switch input electrically connected to the inverting output of the primary transconductor 201, a control input that receives the fourth chopping clock signal CLK4, and a switch output electrically connected to the non-inverting output terminal OUTP.

The channel 200 illustrated in FIG. 4B can be operated in a coarse autozero phase, a fine autozero phase, a non-inverting chop phase, or an inverting chop phase. The channel 200 contributes to the amplifier's amplification when the channel operates in the non-inverting chop phase or in the inverting chop phase.

When the channel 200 operates in the coarse autozero phase, the second and fourth clock signals CLK2, CLK4 can be used to open the thirteenth to sixteenth switches 223-226 to disconnect the channel 200 from the amplifier's signal path. Additionally, the first to fourth clock signals CLK1-CLK4 can be used to close the first, third, fifth, and seventh switches 211, 213, 215, 217, and to open the second, fourth, sixth, and eighth switches 212, 214, 216, 218, thereby electrically connecting the non-inverting input terminal INP to the first and second capacitors 231, 232 and electrically connecting the inverting input terminal INN to the third and fourth capacitors 233, 234. Furthermore, the coarse autozero clock signal AZC and the fine autozero clock signal AZF can be used to close the ninth to twelfth switches 219-222 to operate the primary transconductor 201 with unity-gain feedback.

During the coarse autozero phase, the input offset voltage of the primary transconductor 201 can be sampled differentially across the first and second capacitors 231, 232 and differentially across the third and fourth capacitors 233, 234.

However, when the coarse autozero clock signal AZC transitions from a logical high to a logical low, residual offset voltage may be present across the first and second nodes N1, N2 due to various error sources, including, for example, charge injection mismatches associated with opening the ninth and tenth switches 219, 220.

To reduce the residual offset voltage, the fine autozero clock signal AZF can remain logically high after the coarse autozero phase to operate the channel in the fine autozero phase. The eleventh and twelfth switches 221, 222 can remain closed in the fine autozero phase, and the auxiliary transconductor 202 can operate with feedback to sample a differential voltage onto the fifth and sixth capacitors 235, 236. The voltage sampled onto the fifth and sixth capacitors 235, 236 can be proportional to a residual input offset voltage of the primary transconductor 201. When the eleventh and twelfth switches 221, 222 are subsequently opened, the channel 200 can exhibit a further reduction in input offset voltage, since the auxiliary transconductor 202 can generate an output current that corrects for the primary transconductor's residual input offset voltage. By configuring the channel 200 to include both a coarse autozero phase and a fine autozero phase, the channel 200 can operate with reduced input offset when the channel contributes to the amplifier's amplification.

During the non-inverting chop phase, the first switch 211, the second switch 212, the fifth switch 215, the sixth switch 216, the thirteenth switch 223, and the fourteenth switch 224 can be closed, and the remaining switches can be opened. Configuring the channel 200 in this manner can provide the channel's differential input voltage to the primary transconductor 201 without inversion. Additionally, a differential output current generated by the primary transconductor 201 can be summed with a differential output current generated by the auxiliary transconductor 202, and the resulting current can be provided as an output of the channel 200 without inversion.

During the inverting chop phase, the third switch 213, the fourth switch 214, the seventh switch 217, the eighth switch 218, the fifteenth switch 225, and the sixteenth switch 226 can be closed, and the remaining switches can be opened. Configuring the channel 200 in this manner can provide the channel's differential input voltage to the primary transconductor 201 with inversion. Additionally, a differential output current generated by the primary transconductor 201 can be summed with a differential output current generated by the auxiliary transconductor 202, and the resulting current can be inverted and provided as an output of the channel 200.

Although FIG. 4B illustrates one embodiment of a channel that can be used in the amplifier 140 of FIG. 4A, the amplifier 140 of FIG. 4A can be configured to operate using different implementations of channels.

Figure 5A:
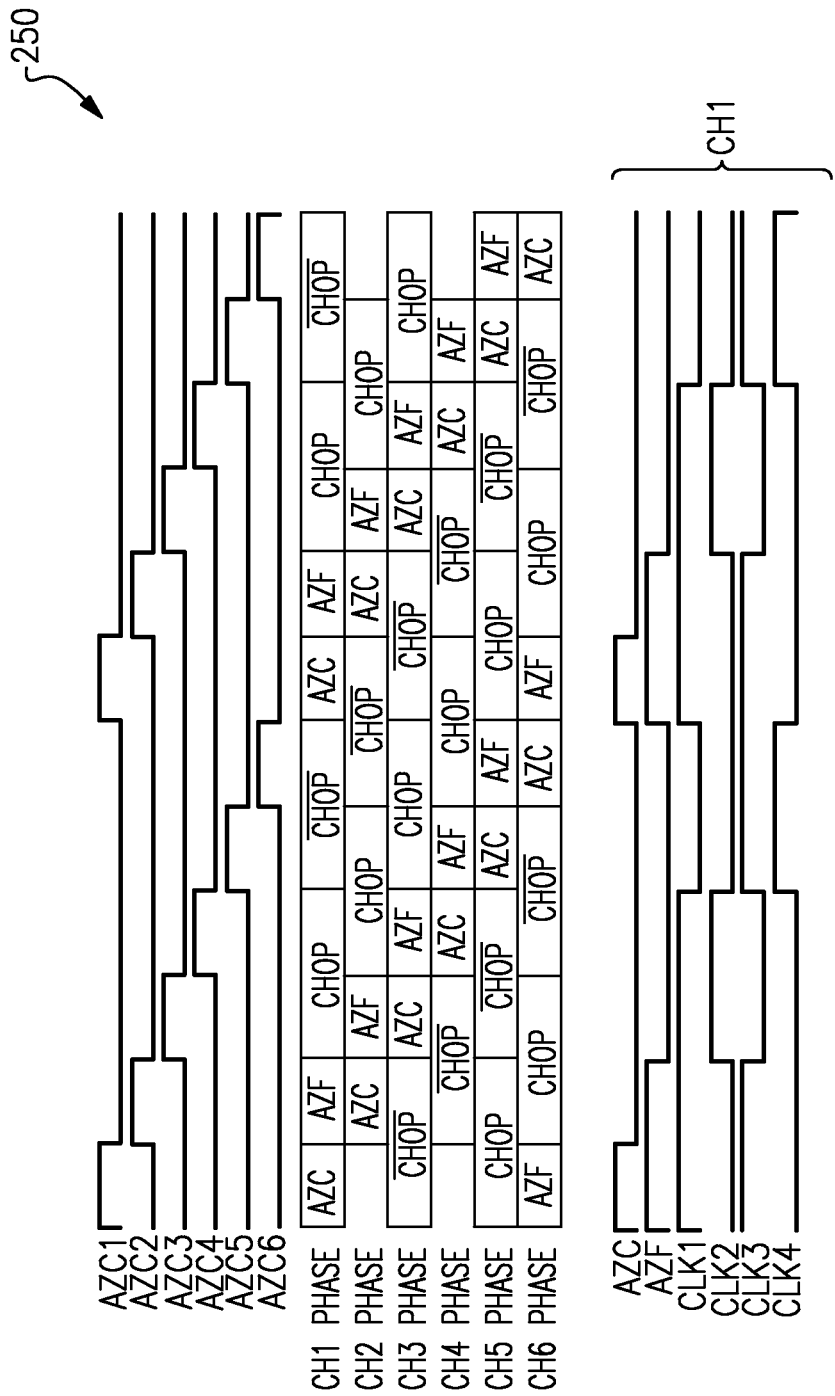
FIG. 5A illustrates one example of a timing diagram for the multi-channel autozero and chopper amplifier of FIG. 4A implemented using the channel of FIG. 4B.

FIG. 5A illustrates one example of a timing diagram 250 for the multi-channel autozero and chopper amplifier 140 of FIG. 4A implemented using the channel 200 of FIG. 4B.

The timing diagram 250 illustrates the phases of the first to sixth channels 141-146 versus time. The timing diagram 250 further illustrates waveforms for six coarse autozero clock signals (AZC1-AZC6), which can correspond to a coarse autozero clock signal received by the first to sixth channels 141-146, respectively. The timing diagram 250 further illustrates timing signal waveforms for various signals of the first channel. Additional timing signal waveforms for the second to sixth channels are not illustrated. In certain configurations, the timing signal waveforms for the second to sixth channels can be similar to those shown for the first channel, but time-shifted relative to the first channel.

When the channel 200 is controlled based on the timing diagram 250 shown in FIG. 5A, four channels of the total six channels provide amplification at any given time. Accordingly, one channel's power dissipation and transconductance amplifier size can be about one-fourth that of a ping-pong autozero and chopper amplifier (which only has one contributing amplifier at any given time) with similar performance. Thus, the amplifier's overall power dissipation and size of the transconductance amplifiers can be about three-fourths that of a ping-pong autozero and chopper amplifier with similar performance. Furthermore, the size of each of the first to eighth switches 211-218 can be one-eighth of the size of corresponding switches of a ping-pong autozero and chopper amplifier. Although various switch sizes have been provided for purposes of comparison, the switches can be any suitable size.

Figure 5B:
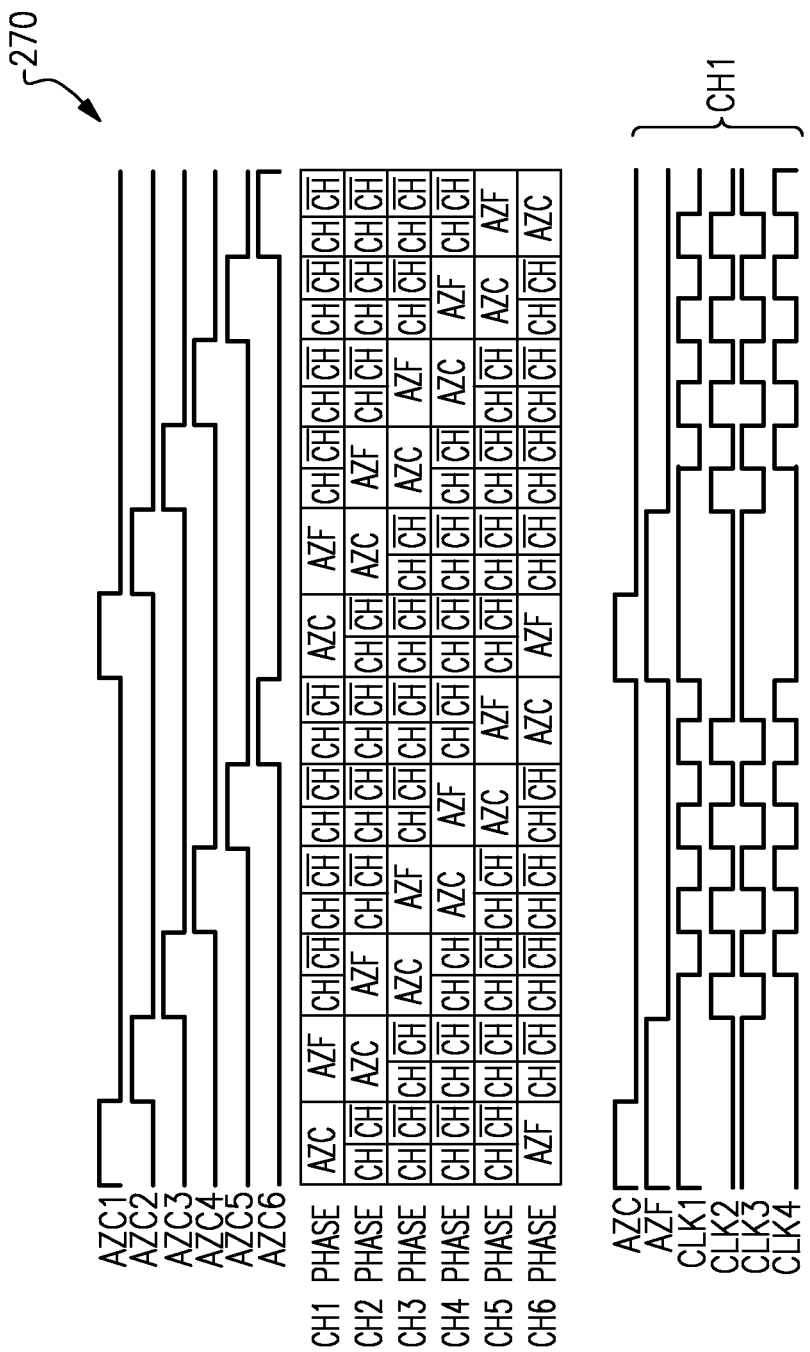
FIG. 5B illustrates another example of a timing diagram for the multi-channel autozero and chopper amplifier of FIG. 4A implemented using the channel of FIG. 4B.

FIG. 5B illustrates another example of a timing diagram 270 for the multi-channel autozero and chopper amplifier 140 of FIG. 4A implemented using the channel 200 of FIG. 4B.

In the illustrated timing configuration, each of the first to sixth channels 141-146 operate with independent and interleaved autozero clock signals, but the chopping clock signals can be based on a common clock signal. For instance, the first chopping clock signal CLK1, the second chopping clock signal CLK2, the third chopping clock signal CLK3, and the fourth chopping clock signal CLK4 shown in FIG. 4B can be generated by taking circuit logic operations of the fine autozero clock signal AZF and the common clock signal. While the fine autozero clock signals are independent for the first to sixth channels, the common clock signal can be shared. The timing diagram 270 of FIG. 5B can be associated with a chopping frequency that is about four times greater than a chopping frequency associated with the timing diagram 250 of FIG. 5A.

Figure 5C:
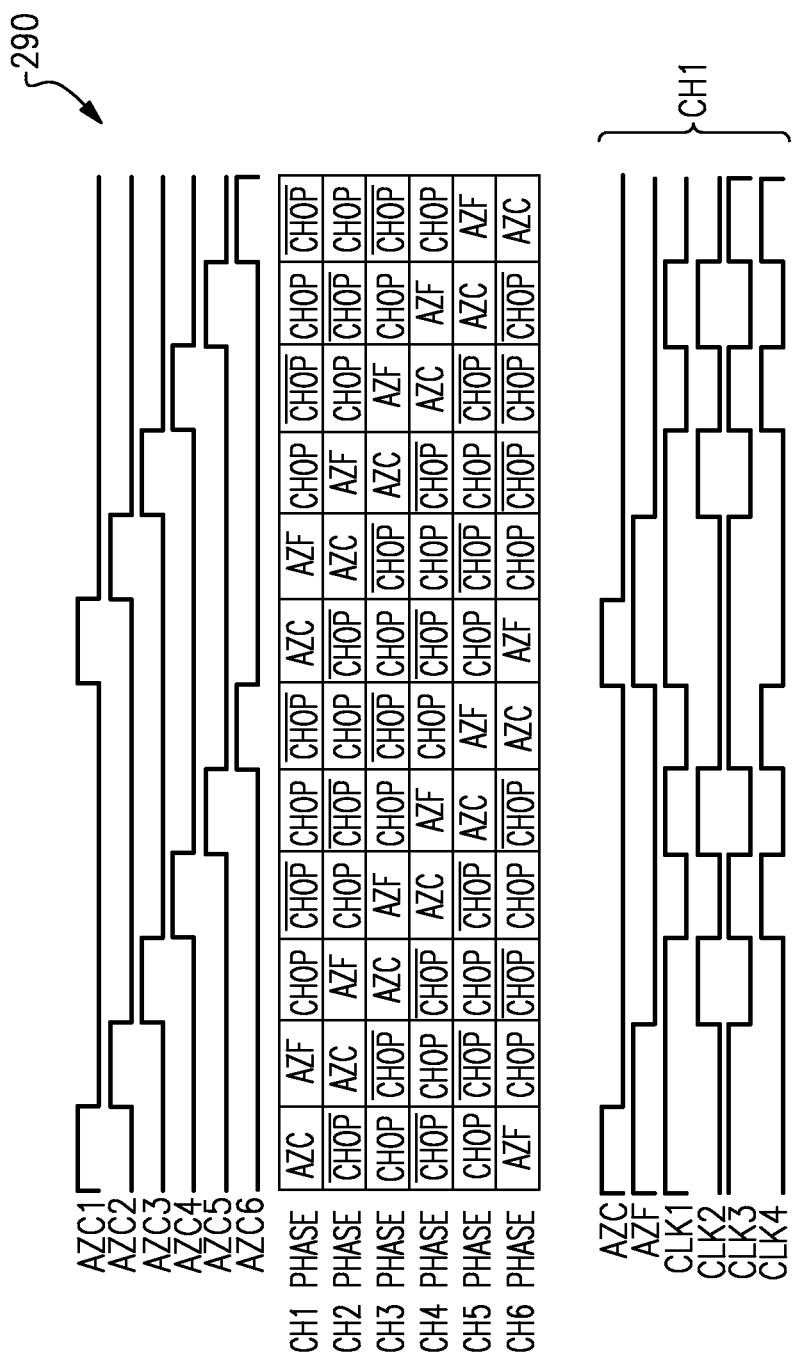
FIG. 5C illustrates another example of a timing diagram for the multi-channel autozero and chopper amplifier of FIG. 4A implemented using the channel of FIG. 4B.

FIG. 5C illustrates another example of a timing diagram 290 for the multi-channel autozero and chopper amplifier 140 of FIG. 4A implemented using the channel 200 of FIG. 4B.

In the illustrated timing configuration, each of the first to sixth channels 141-146 operate with independent and interleaved autozero clock signals, and with chopping clock signals that are phase-shifted by about 180 degrees for odd numbered channels relative to even number channels. The timing diagram 290 of FIG. 5C can be associated with a chopping frequency that is about two times greater than a chopping frequency associated with the timing diagram 250 of FIG. 5A.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, consumer electronic products, parts of the consumer electronic products, electronic test equipment, medical imaging and monitoring, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An amplifier comprising:
a plurality of channels comprising:
a first channel;
a second channel; and
a third channel, wherein each of the first channel, the second channel, and the third channel are operable in a plurality of phases including an autozero phase, a non-inverting chop phase, and an inverting chop phase; and
a timing control circuit configured to operate the first channel in the autozero phase during a first time interval and to operate two or more other channels in at least one of the non-inverting chop phase or the inverting chop phase during the first time interval, wherein the timing control circuit is further configured to operate the second channel in the autozero phase during a second time interval and to operate two or more other channels in at least one of the non-inverting chop phase or the inverting chop phase during the second time interval, and wherein the timing control circuit is further configured to operate the third channel in the autozero phase during a third time interval and to operate two or more other channels in at least one of the non-inverting chop phase or the inverting chop phase during the third time interval,
wherein the first time interval, the second time interval, and the third time interval are staggered in time with respect to one another.

2. The amplifier of claim 1, wherein the plurality of channels comprises four or more channels.

3. An amplifier comprising:
a plurality of channels comprising:
a first channel;
a second channel;
a third channel; and
a fourth channel, wherein each of the first channel, the second channel, the third channel, and the fourth channel are operable in a plurality of phases including an autozero phase, a non-inverting chop phase, and an inverting chop phase; and
a timing control circuit configured to operate the first channel in the autozero phase during a first time interval, to operate the second channel in the autozero phase during a second time interval, to operate the third channel in the autozero phase during a third time interval, and to operate the fourth channel in the autozero phase during a fourth time interval,
wherein the first time interval, the second time interval, the third time interval, and the fourth time interval are staggered in time with respect to one another.

4. The amplifier of claim 3,
wherein the plurality of channels further comprises:
a fifth channel; and
a sixth channel, wherein the fifth channel and the sixth channel are operable in the plurality of phases including the autozero phase, the non-inverting chop phase, and the inverting chop phase; and
wherein the timing control circuit is further configured to operate the fifth channel in the autozero phase during a fifth time interval, and to operate the sixth channel in the autozero phase during a sixth time interval,
wherein the first time interval, the second time interval, the third time interval, the fourth time interval, the fifth time interval, and the sixth time interval are staggered in time with respect to one another.

5. The amplifier of claim 4, wherein the timing control circuit is further configured to operate the first channel in the autozero phase during a seventh time interval that is after the first time interval, wherein the first and second time intervals are partially overlapping in time, wherein the second and third time intervals are partially overlapping in time, wherein the third and fourth time intervals are partially overlapping in time, wherein the fourth and fifth time intervals are partially overlapping in time, wherein the fifth and sixth time intervals are partially overlapping in time, wherein the sixth and seventh time intervals are partially overlapping in time.

6. The amplifier of claim 1, wherein at least one of the plurality of channels operates in the non-inverting chop phase or the inverting chop phase at any given time that the amplifier is enabled.

7. The amplifier of claim 6, wherein the amplifier is configured to receive a differential input voltage, wherein the at least one of the plurality of channels operating in the non-inverting chop phase or the inverting chop phase amplifies the differential input voltage.

8. An amplifier comprising:
a plurality of channels comprising:
a first channel;
a second channel; and
a third channel, wherein each of the first channel, the second channel, and the third channel are operable in a plurality of phases including an autozero phase, a non-inverting chop phase, and an inverting chop phase; and
a timing control circuit configured to operate the first channel in the autozero phase during a first time interval, to operate the second channel in the autozero phase during a second time interval, and to operate the third channel in the autozero phase during a third time interval,
wherein the first time interval, the second time interval, and the third time interval are staggered in time with respect to one another, wherein the first channel, the second channel, and the third channel are configured to share input chopping switches and output chopping switches.

9. An amplifier comprising:
a plurality of channels comprising:
   a first channel;
   a second channel; and
   a third channel, wherein each of the first channel, the second channel, and the third channel are operable in a plurality of phases including an autozero phase, a non-inverting chop phase, and an inverting chop phase; and
a timing control circuit configured to operate the first channel in the autozero phase during a first time interval, to operate the second channel in the autozero phase during a second time interval, and to operate the third channel in the autozero phase during a third time interval,
wherein the first time interval, the second time interval, and the third time interval are staggered in time with respect to one another,
wherein the first channel includes first input chopping switches and first output chopping switches, wherein the second channel includes second input chopping switches and second output chopping switches, and wherein the third channel includes third input chopping switches and third output chopping switches.

10. The amplifier of claim 9, wherein the timing control circuit is configured to generate a plurality of chopping clock signals that are interleaved in time, wherein a first portion of the plurality of chopping clock signals are configured to control the first input chopping switches and the first output chopping switches, wherein a second portion of the plurality of chopping clock signals are configured to control the second input chopping switches and the second output chopping switches, and wherein a third portion of the plurality of chopping clock signals are configured to control the third input chopping switches and the third output chopping switches.

11. The amplifier of claim 1, wherein the first channel comprises a first transconductance amplification circuit, wherein the second channel comprises a second transconductance amplification circuit, and wherein the third channel comprises a third transconductance amplification circuit.

12. The amplifier of claim 11, further comprising at least one node configured to generate a summed current based on a plurality of output currents generated by the plurality of channels.

13. The amplifier of claim 12, further comprising an output stage configured to convert the summed current to an output voltage of the amplifier.

14. The amplifier of claim 11, wherein the amplifier is configured to receive a differential input voltage,
wherein the first transconductance amplification circuit is configured to receive the differential input voltage signal without inversion when the first channel operates in the non-inverting chop phase, wherein the first transconductance amplification circuit is configured to receive the differential input voltage signal with inversion when the first channel operates in the inverting chop phase,
wherein the second transconductance amplification circuit is configured to receive the differential input voltage signal without inversion when the second channel operates in the non-inverting chop phase, wherein the second transconductance amplification circuit is configured to receive the differential input voltage signal with inversion when the second channel operates in the inverting chop phase, and
wherein the third transconductance amplification circuit is configured to receive the differential input voltage signal without inversion when the third channel operates in the non-inverting chop phase, wherein the third transconductance amplification circuit is configured to receive the differential input voltage signal with inversion when the third channel operates in the inverting chop phase.

15. The amplifier of claim 14,
wherein a first output current of the first transconductance amplification circuit is provided as an output of the first channel when the first channel operates in the non-inverting chop phase, wherein an inverted version of the first output current is provided as the output of the first channel when the first channel operates in the inverting chop phase,
wherein a second output current of the second transconductance amplification circuit is provided as an output of the second channel when the second channel operates in the non-inverting chop phase, wherein an inverted version of the second output current is provided as the output of the second channel when the second channel operates in the inverting chop phase, and
wherein a third output current of the third transconductance amplification circuit is provided as an output of the third channel when the third channel operates in the non-inverting chop phase, wherein an inverted version of the third output current is provided as the output of the third channel when the third channel operates in the inverting chop phase.

16. An amplifier comprising:
a plurality of channels comprising:
   a first channel;
   a second channel; and
   a third channel, wherein each of the first channel, the second channel, and the third channel are operable in a plurality of phases including an autozero phase, a non-inverting chop phase, and an inverting chop phase, wherein the autozero phase comprises a coarse autozero phase; and
a timing control circuit configured to operate the first channel in the autozero phase during a first time interval, to operate the second channel in the autozero phase during a second time interval, and to operate the third channel in the autozero phase during a third time interval,
wherein the first time interval, the second time interval, and the third time interval are staggered in time with respect to one another,
wherein the plurality of phases further comprises a fine autozero phase, wherein the fine autozero phase is configured to correct for a residual input offset voltage remaining after the coarse autozero phase.

17. An amplifier comprising:
a non-inverting input voltage terminal and an inverting input voltage terminal, wherein the amplifier is configured to receive a differential input voltage between the non-inverting input voltage terminal and the inverting input voltage terminal;
a plurality of channels comprising a first channel, a second channel, and a third channel; and
a timing control circuit configured to control an autozero sequence of the plurality of channels, wherein the timing control circuit is configured to autozero the first channel during a first time interval, to autozero the second channel during a second time interval, and to autozero the third channel during a third time interval, wherein the first time interval, the second time interval, and the third time interval are staggered in time with respect to one another, wherein during operation of the amplifier at least one channel of the plurality of channels is configured to amplify the differential input voltage at any given time, wherein the timing control circuit is configured to control operation of the plurality of channels in a plurality of phases over time, wherein the plurality of phases comprise an autozero phase, a non-inverting chop phase, and an inverting chop phase.

18. The amplifier of claim 17, wherein the plurality of channels comprises four or more channels.

19. The amplifier of claim 17, wherein the first channel, the second channel, and the third channel share input chopping switches and output chopping switches.

20. The amplifier of claim 17, wherein the autozero phase comprises a coarse autozero phase, wherein the plurality of phases further comprises a fine autozero phase that corrects for a residual input offset voltage remaining after the coarse autozero phase.

21. The amplifier of claim 17, wherein the plurality of channels comprise a plurality of differential transconductance stages configured to generate a plurality of differential output currents based on amplifying the differential input voltage, wherein the amplifier further comprises a pair of nodes configured to receive the plurality of differential output currents.

22. The amplifier of claim 21, further comprising a feedback capacitor and an output stage, wherein the output stage comprises a non-inverting input electrically connected to a first node of the pair of nodes, an inverting input electrically connected to a second node of the pair of nodes, and an output electrically connected to the inverting input via the feedback capacitor.

23. The amplifier of claim 1, wherein the timing control circuit is further configured to operate the second channel in the non-inverting chop phase during a first portion of the first time interval and to operate the second channel in the inverting chop phase during a second portion of the first time interval.

24. The amplifier of claim 23, wherein the timing control circuit is further configured to operate the third channel in the non-inverting chop phase during the first portion of the first time interval and to operate the third channel in the inverting chop phase during the second portion of the first time interval.

25. The amplifier of claim 1, wherein the timing control circuit is further configured to operate the second channel in one of the non-inverting chop phase or the inverting chop phase during the first time interval and to operate the third channel in the other of the non-inverting chop phase or the inverting chop phase during the first time interval.

26. The amplifier of claim 3, wherein at least one of the plurality of channels operates in the non-inverting chop phase or the inverting chop phase at any given time that the amplifier is enabled.

27. The amplifier of claim 3, wherein the timing control circuit is further configured to operate the second channel in the non-inverting chop phase during a first portion of the first time interval and to operate the second channel in the inverting chop phase during a second portion of the first time interval.

28. The amplifier of claim 8, wherein at least one of the plurality of channels operates in the non-inverting chop phase or the inverting chop phase at any given time that the amplifier is enabled.

29. The amplifier of claim 8, wherein the timing control circuit is further configured to operate the second channel in the non-inverting chop phase during a first portion of the first time interval and to operate the second channel in the inverting chop phase during a second portion of the first time interval.

30. The amplifier of claim 9, wherein at least one of the plurality of channels operates in the non-inverting chop phase or the inverting chop phase at any given time that the amplifier is enabled.

31. The amplifier of claim 9, wherein the timing control circuit is further configured to operate the second channel in the non-inverting chop phase during a first portion of the first time interval and to operate the second channel in the inverting chop phase during a second portion of the first time interval.

32. The amplifier of claim 16, wherein at least one of the plurality of channels operates in the non-inverting chop phase or the inverting chop phase at any given time that the amplifier is enabled.

33. The amplifier of claim 16, wherein the timing control circuit is further configured to operate the second channel in the non-inverting chop phase during a first portion of the first time interval and to operate the second channel in the inverting chop phase during a second portion of the first time interval.

* * * * *